United States Patent
Yayama et al.

(10) Patent No.: US 8,736,337 B2
(45) Date of Patent: May 27, 2014

(54) SEMICONDUCTOR DEVICE, WITH HIGH-RESOLUTION AND WIDE-RANGE ADJUSTABLE CLOCK

(75) Inventors: Kosuke Yayama, Kanagawa (JP); Takashi Nakamura, Kanagawa (JP)

(73) Assignee: Renesas Electronics Corporation, Kawasaki-Shi (JP)

( * ) Notice: Subject to any disclaimer, the term of this patent is extended or adjusted under 35 U.S.C. 154(b) by 158 days.

(21) Appl. No.: 13/333,448

(22) Filed: Dec. 21, 2011

(65) Prior Publication Data

US 2012/0161868 A1    Jun. 28, 2012

(30) Foreign Application Priority Data

Dec. 28, 2010   (JP) ................................ 2010-291630

(51) Int. Cl.
*H03L 7/06* (2006.01)

(52) U.S. Cl.
USPC .......................................... 327/291; 327/293

(58) Field of Classification Search
USPC ......... 327/291, 293, 261, 263, 264, 268, 272, 327/276–278, 284, 285, 270, 283, 290
See application file for complete search history.

(56) References Cited

U.S. PATENT DOCUMENTS

| | | | |
|---|---|---|---|
| 7,656,225 B2 | 2/2010 | Isobe et al. | |
| 7,911,252 B2 * | 3/2011 | Kondou | ........................ 327/291 |

FOREIGN PATENT DOCUMENTS

| | | |
|---|---|---|
| JP | 2002-300027 A | 10/2002 |
| JP | 2007-293545 A | 11/2007 |

\* cited by examiner

*Primary Examiner* — Hai L Nguyen
(74) *Attorney, Agent, or Firm* — Miles & Stockbridge P.C.

(57) ABSTRACT

A clock signal capable of changing the frequency in a wide range and with high resolution is generated.
An operational amplifier AMP1 is subject to feedback control so that the voltage of a positive input part equals that of a negative input part. The voltage of a circuit node fbck equals a reference voltage VREFI. A decoder DEC decodes control signals CNT7 and CNT6 and turns on one of transistors T2 to T5. This configuration provides feedback control so that the voltage of the circuit node fbck equals the reference voltage VREFI. This significantly reduces the on-resistances of the transistors T2 to T5 and prevents the degradation of the frequency accuracy.

10 Claims, 9 Drawing Sheets

SEMICONDUCTOR DEVICE, WITH HIGH-RESOLUTION AND WIDE-RANGE ADJUSTABLE CLOCK

CROSS-REFERENCE TO RELATED APPLICATION

The disclosure of Japanese Patent Application No. 2010-291630 filed on Dec. 28, 2010 including the specification, drawings and abstract is incorporated herein by reference in its entirety.

BACKGROUND

The present invention relates to techniques effective in semiconductor devices with a clock oscillation circuit generating a clock signal used for circuit operation.

Semiconductor devices, such as general-purpose microcomputers, need to reduce the number of external components for miniaturization and cost reduction of equipment. Some semiconductor devices have an on-chip oscillator, which uses no external components, such as a crystal oscillator, in a clock oscillation circuit which generates a clock signal supplied to internal modules, such as a CPU (Central Processing Unit) and a peripheral functional block.

Frequency accuracy is an important characteristic of the on-chip oscillator. This is a frequency variation relative to a power supply variation or a temperature variation. The low frequency accuracy of the on-chip oscillator limits the application of the on-chip oscillator as the alternative component of an external oscillator.

Widening the application range needs to increase the frequency accuracy of the on-chip oscillator. The range can be further widened by heightening the frequency accuracy and covering a wide oscillation frequency range. General-purpose microcomputers usually allows users to change the settings according to an intended application.

For example, the on-chip oscillator, requiring high frequency accuracy, is performed temperature trimming in order to improve the frequency accuracy. Temperature trimming sets a control signal to cancel the temperature dependence of a circuit and that of a device that is being used.

Trimming at two temperature points can cancel the first-order temperature coefficient. Trimming at three temperature points can cancel the second-order temperature coefficient, too.

An example of this type of clock oscillation circuits is the one which stabilizes the oscillation frequency and heightens the oscillation accuracy by connecting a current-controlled oscillator, a frequency divider, a period comparison circuit, an integration circuit, and a voltage-current conversion circuit in series, returning the output current of the voltage-current conversion circuit at the final stage to the input side of the current-controlled oscillator at the first stage, and using the output of the current-controlled oscillator as the oscillation output (see Japanese Patent Laid-Open No. 2002-300027 (Patent Document 1)).

Moreover, a voltage generation circuits generating a plurality of voltages with high accuracy is the one including a reference voltage generation circuit, a differential amplifier, a P-channel MOS (Metal Oxide Semiconductor) transistor, a switching transistor, an output node, and a first to a third resistor strings. The third resistor string is between other input terminal of the differential amplifier and a ground. Even when the resistance of the first resistor string between the drain of the P-channel MOS transistor and an output node and that of the second resistor string between the output node and the other input terminal of the differential amplifier, which differs from that of the first resistor string, are selected and controlled, these resistances are selected and controlled so that a sum of the resistance of the first resistor string and that of the second resistor string is constant (see Japanese Patent Laid-Open No. 2007-293545 (Patent Document 2)).

SUMMARY

The present inventor has found that the clock generation technique in the above on-chip oscillators has the following problems.

The clock oscillation circuit using an on-chip oscillator includes a reference voltage generation circuit, a voltage-current conversion circuit, a control circuit, a frequency-voltage conversion circuit, and a voltage-controlled oscillation circuit, for example. A feedback loop has the frequency-voltage conversion circuit, the voltage-controlled oscillation circuit, and the control circuit.

The reference voltage generation circuit generates reference voltages VREFI and VREFC, and outputs them to the current generation circuit and the oscillation circuit, respectively. The voltage-current conversion circuit outputs a nearly constant current according to the reference voltages.

A current Iref, which has a low power supply voltage dependence and a low temperature dependence, is generated. The frequency-voltage conversion circuit generates a voltage VSIG, according to the current Iref generated by the current generation circuit, a capacitance, and a control signal generated by the control circuit.

The control circuit generates a control signal according to the clock signal generated by the voltage-controlled oscillation circuit. The frequency-voltage conversion circuit generates a voltage according to the current generated by the current generation circuit, the capacitance, and the control signal generated by the control circuit from the clock signal output from the voltage-controlled oscillation circuit. The oscillation circuit includes an integration circuit.

The integration circuit varies the control voltage of the voltage-controlled oscillation circuit so that the reference voltage VREFC generated by the reference voltage generation circuit equals the voltage VSIG output from the frequency-voltage conversion circuit, and adjusts the clock period to a desired frequency.

A formula below can express an oscillation frequency FCKOUT of this clock oscillation circuit.

$$FCKOUT = \frac{VREFI}{R \times C \times VREFC} \qquad \text{Formula 1}$$

This method cancel the temperature dependence of a resistance and that of a capacitance by temperature trimming for a ratio of the reference voltage VREFI to the reference voltage VREFC, so that the oscillation frequency FCKOUT is constant to temperatures.

The absolute value of the frequency is obtained by switching a capacitor C of the frequency-voltage conversion circuit or a resistor R of the voltage-current conversion circuit. Usually, the capacitor is used to roughly (coarsely) adjust the frequency and the resistor is used to finely adjust the absolute value of the frequency.

To allow users to arbitrarily set the frequency, the frequencies should be able to be switched when a capacitance or a resistance changes.

The technique for changing a capacitance causes low area efficiency when a lot of capacitors with a low capacitance are arranged, increasing the layout area of the clock oscillation circuit. Therefore, the capacitor is an inappropriate element to increase the resolution of the frequency adjustment and widen the frequency range. The designer needs to adjust frequency in a wide range while increasing the resolution of the frequency adjustment without changing the oscillation frequency accuracy, by changing the resistance.

Furthermore, because semiconductor devices exemplified by general-purpose microcomputers needs to lower power consumption, the frequency needs to be adjusted in a wide range at a low operating voltage of approximately 1.35 V, for example. This increases the difficulty of this technical problem.

A purpose of the present invention is to provide a technique for changing the frequency of a clock signal in a wide range and with high resolution.

The description of this specification and the accompanying drawings clarify the other purposes and the new feature of the present invention.

The following explains briefly the outline of a typical invention among the inventions disclosed in the present application.

A semiconductor device of the present invention has a clock oscillation circuit outputting a clock signal and an internal circuit which operates in response to an operation frequency signal generated according to the clock signal. The clock oscillation circuit has a current-voltage conversion circuit including a transistor supplying a reference current; an operational amplifier having a positive input part, a negative input part, and an output part; a first resistor-switching section connected between a drain of the transistor and a first node; and a second resistor-switching section connected between the first node and a reference voltage line to which a reference voltage is supplied. The first resistor-switching section has a first resistor section, which includes a first resistor, to which a plurality of resistors is connected in series, and a first end of which connects to the first node. A first path-switching section has a first and a second switch connected to the drain. By a control signal, the first path-switching section determines whether to supply the reference current to the first resistor and the second resistor-switching section via the first switch and to supply the reference current to the second resistor-switching section via the second switch without supplying the reference current to the first resistor. The operational amplifier has the negative input part, to which a reference voltage is input; the positive input part, to which a second end of the first resistor section connects; and the output part, to which a gate of the transistor connects.

The semiconductor device of the present invention has the second resistor-switching section which includes a second resistor and in which a plurality of resistors is connected in series; and a second path-switching section including a third switch controlled by the control signal. The third switch is connected to the second resistor in parallel.

The semiconductor device of the present invention has the first switch and the second switch which are P-channel MOS transistors; and the third switch which is an N-channel MOS transistor.

The semiconductor device of the present invention has the first switch and the second switch which are nearer to the first resistor section than to the second resistor section; and the third switch which is nearer to the second resistor section than to the first resistor section. The first switch, the second switch, and the third switch are separate from each other.

The semiconductor device of the present invention has the first resistor section and the second resistor section each of which includes a metal wiring resistor.

The semiconductor device of the present invention has the first resistor section which is in an upper layer of the first path-switching section; and the second resistor section which is in an upper layer of the second path-switching section.

The semiconductor device of the present invention has the first resistor section and the second resistor section each of which includes a polysilicon resistor.

The semiconductor device of the present invention has the first resistor with a resistance higher than that of the resistors constituting the second resistor section.

The semiconductor device of the present invention has the plurality of resistors which constitutes the second resistor section, is connected in series, and each of which has resistance that is twice sequentially from the resistor connected to the reference voltage line. At least one of the resistors constituting the first resistor section has a resistance that is twice the highest resistance of the resistor among the resistors constituting the second resistor section.

The following explains briefly the effect acquired by the typical invention among the inventions disclosed in the present application.

(1) The frequency switching resolution can be increased and a clock signal can be generated in a wide range and with high accuracy.

(2) (1) can improve the reliability of a semiconductor device.

DETAILED DESCRIPTION

The embodiments of the present invention will be described in detail in accordance with on the accompanying drawings. In all the drawings for explaining embodiments, the same symbol is attached to the same member, as a principle, and the repeated explanation is omitted.

Overview of the Embodiment

Figure 1:
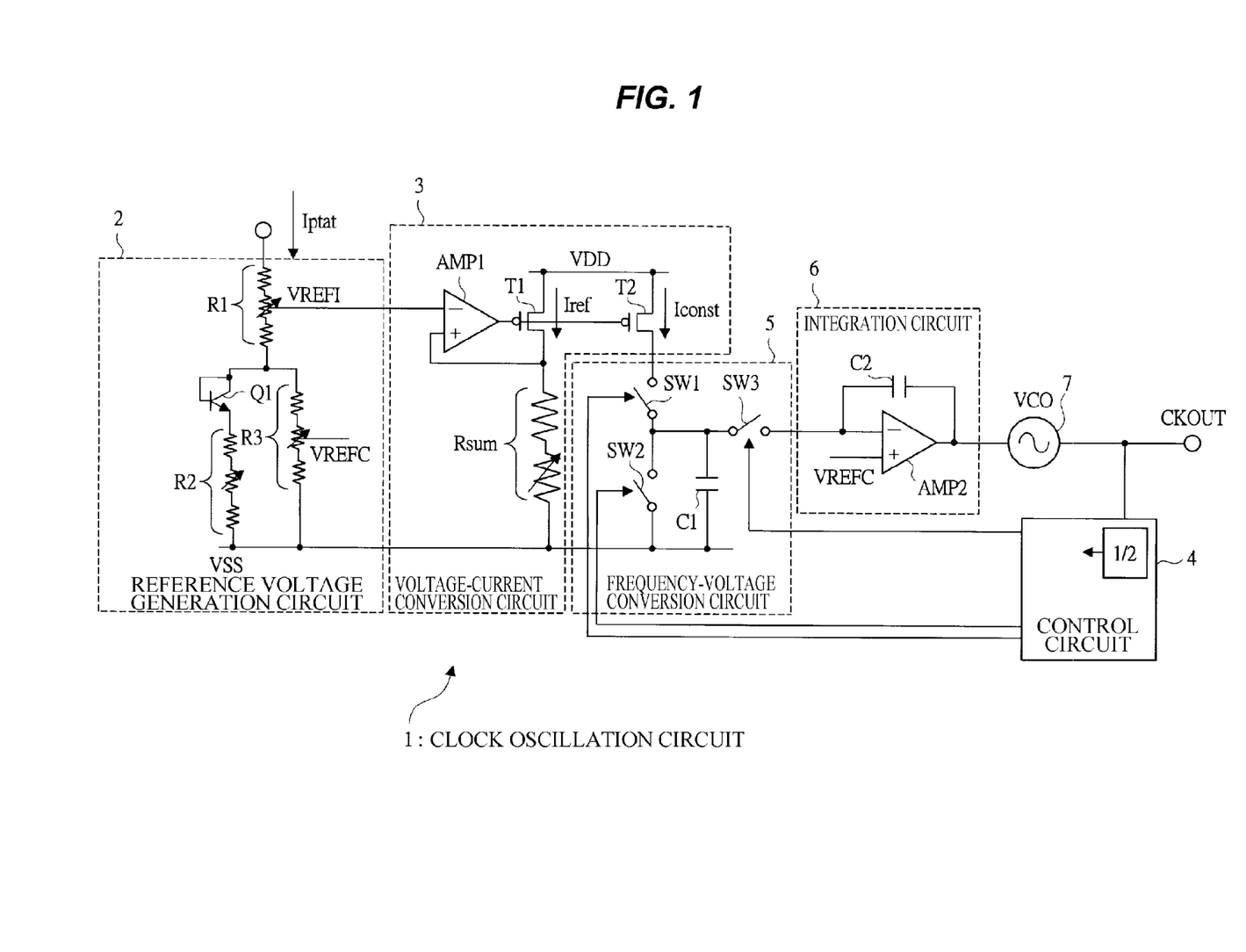
FIG. 1 is a block diagram showing a configuration of a clock oscillation circuit according to an embodiment of the present invention.

A semiconductor device (semiconductor device 8) according to an embodiment of the present invention includes a clock oscillation circuit outputting a clock signal and internal circuits (a CPU 9, a volatile memory 10, and the like in FIG. 7) operating in response to an operation frequency generated according to the clock signal, as shown in FIG. 1.

Moreover, the clock oscillation circuit includes a voltage-current conversion circuit 3 converting a voltage to a current.

The voltage-current conversion circuit 3 includes a transistor (transistor T1) supplying a reference current (current Iref); a first resistor-switching section and a second resistor-switching section which switch the path of the reference current output from the transistor in accordance with a control signal; and an operational amplifier (operational amplifier AMP1) which controls the transistor supplying the reference current.

Figure 2:
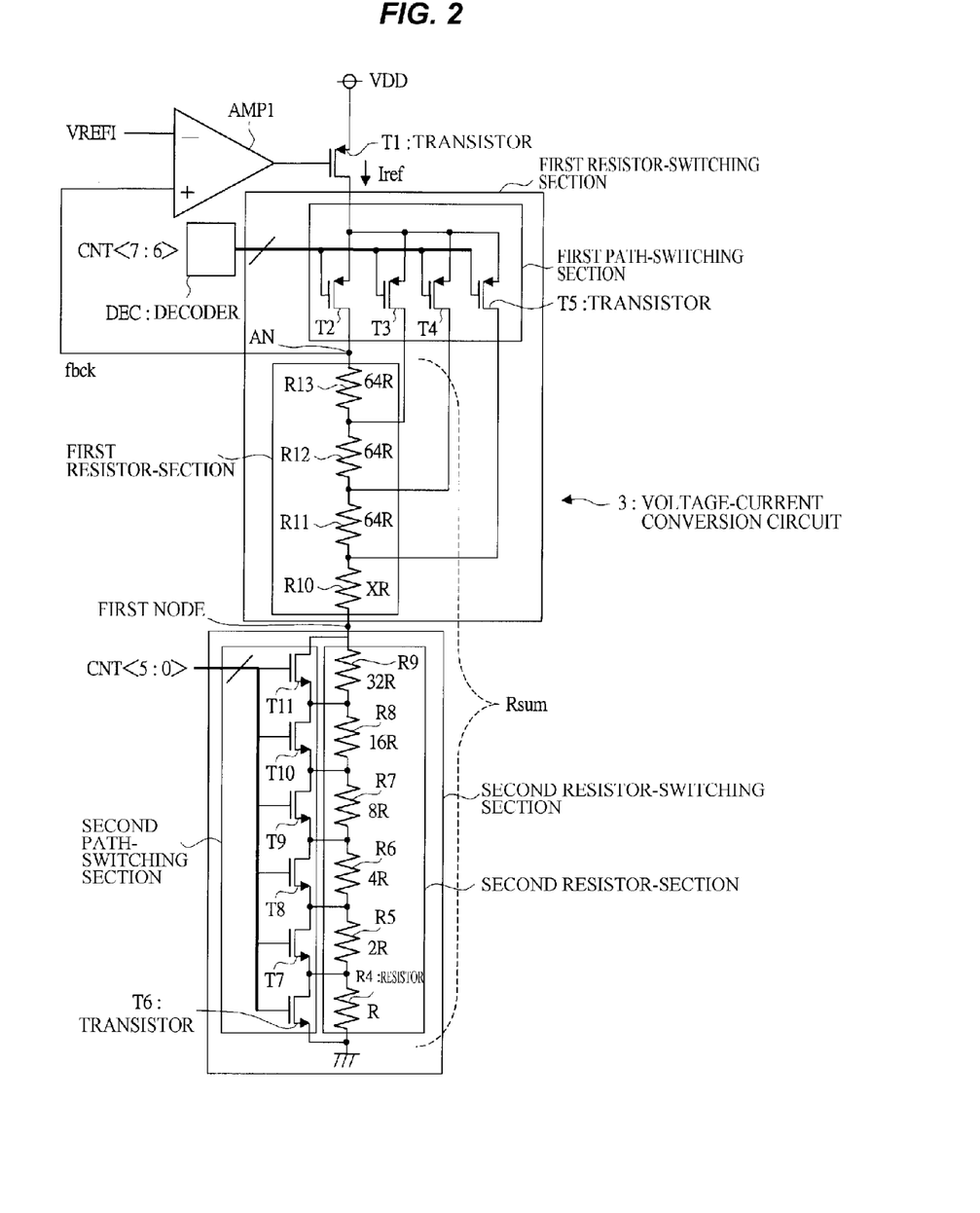
FIG. 2 is an explanatory view showing a detailed configuration of a voltage-current conversion circuit in the clock oscillation circuit in FIG. 1.

The first resistor-switching section includes a first path-switching section (transistors T2 to T5) and a first resistor section (R10 to R13).

The first resistor section includes a first end and a second end, in which a plurality of resistors (from R10 to R13) is connected in series. The plurality of resistors includes a first resistor R13.

The first path-switching section includes a transistor T2 which is a first switch and a transistor T3 which is a second switch, and connects to the drain of the transistor T1.

Moreover, at a node AN, the first path-switching section connects to the second end of the first resistor section.

The first path-switching section switches, by a control signal, determines whether to supply the reference current to the first resistor and the second resistor-switching section via the transistor T2 and to supply the reference current to the second resistor-switching section via the transistor T3.

When the reference current is supplied to the second resistor-switching section via the transistor T3, no reference current flows through the first resistor.

To describe with reference to FIG. 2 the control signal determines whether to supply the current through a path to the resistors R13, R12, R11 and R10 and to the second resistor-switching section via the transistor T2 or to supply the current through a path to the resistors R12, R11 and R10 and to the second resistor-switching section via the transistor T3.

The operational amplifier AMP1 has a negative input part to which a reference voltage (reference voltage VREFI) with a temperature characteristic is input; a positive input part to which the node AN connects; and an output part to which the gate of the transistor supplying the reference current connects.

The second resistor-switching section is connected between the first node and a reference voltage line to which a reference voltage is supplied.

The first node connects to the first end of the first resistor section.

The second resistor-switching section includes the second path-switching section (transistors T6 to T11) and the second resistor section (resistors R4 to R9).

The second path-switching section includes a third switch (T6) connected in parallel to the second resistor (R4) which is included in the second resistor section. The third switch is turned on/off in accordance with the control signal which determines whether to supply the current to the second resistor or to cause the current to bypass the second resistor.

Figure 3:
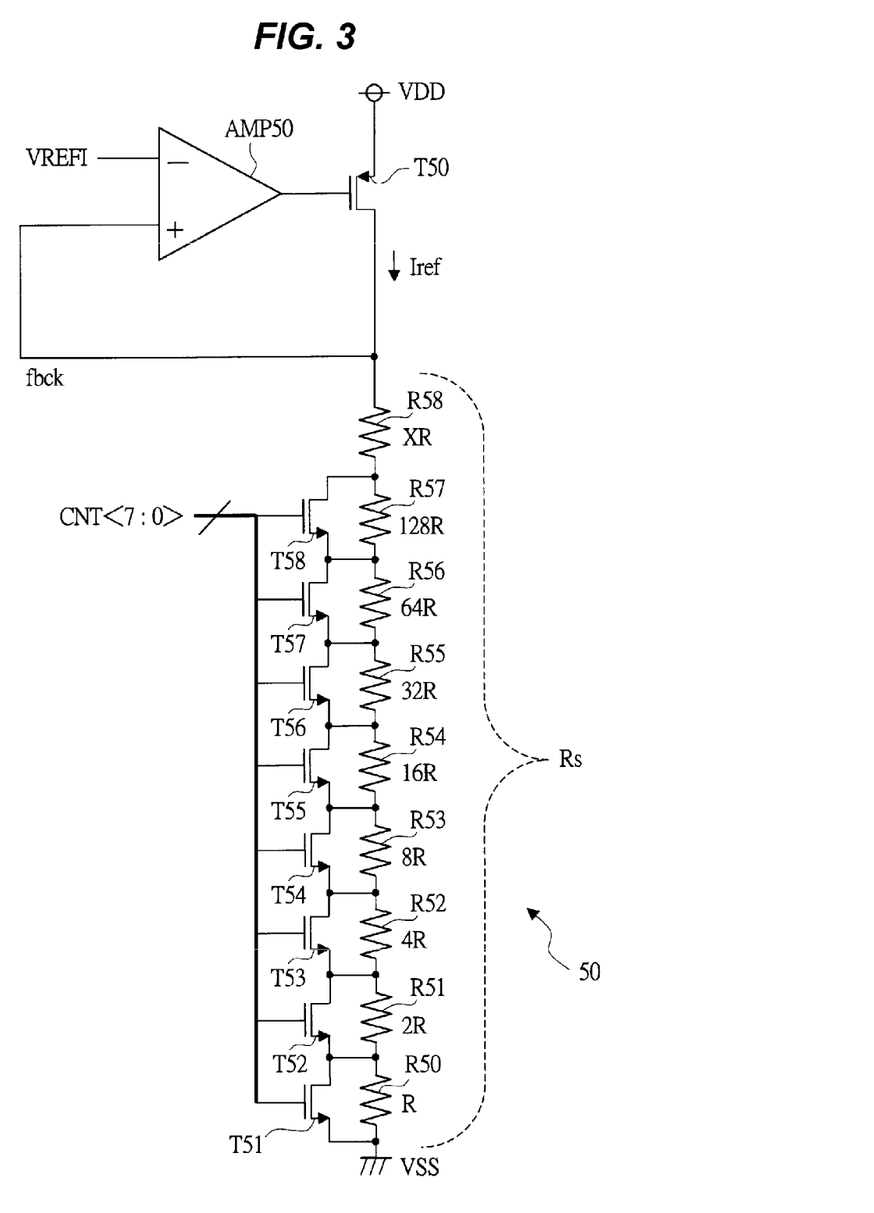
FIG. 3 is an explanatory view showing a configuration of a voltage-current conversion circuit in an on-chip oscillator which the present inventor studied.
Figure 4:
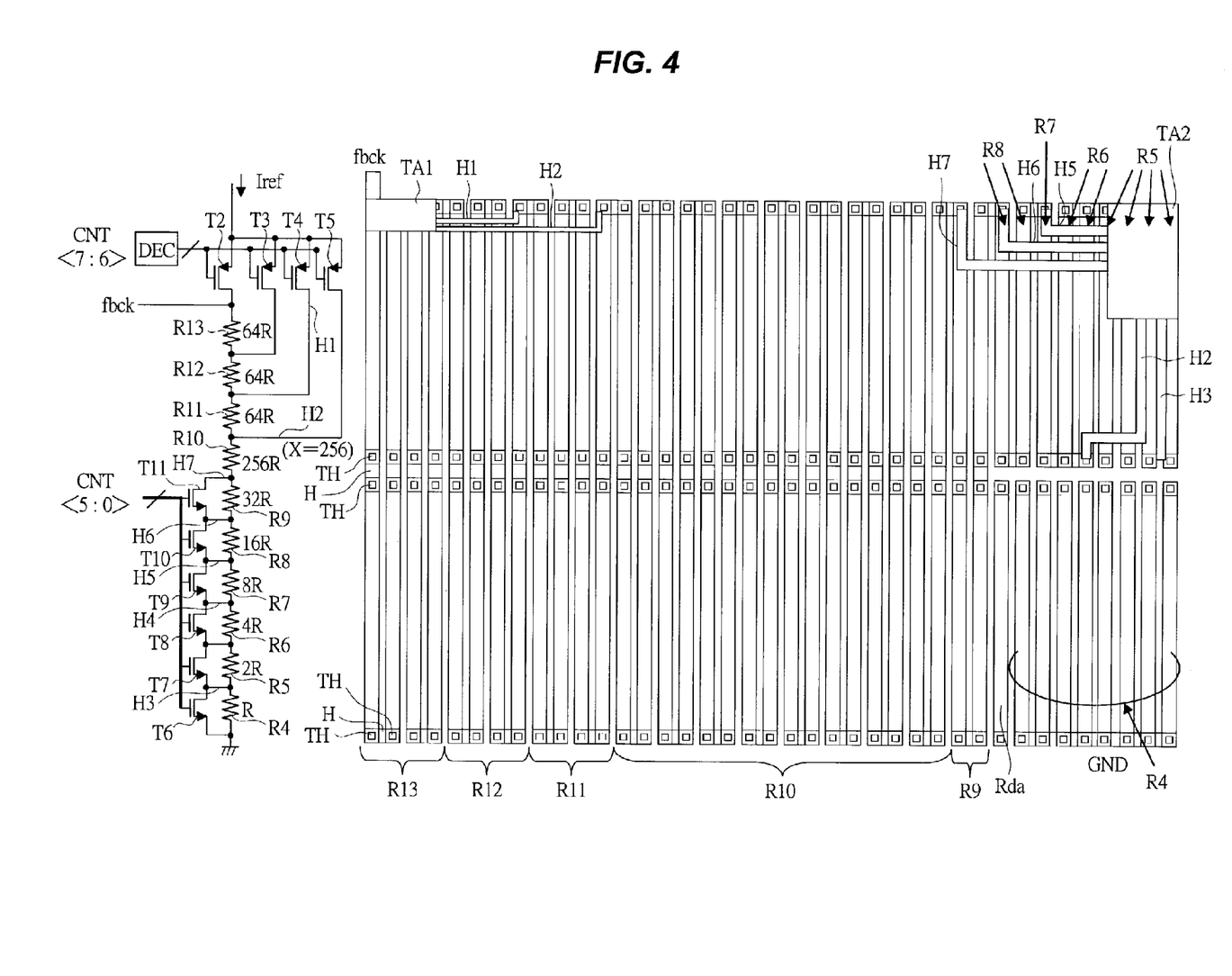
FIG. 4 is an explanatory view showing a layout of resistors in FIG. 2.
Figure 5:
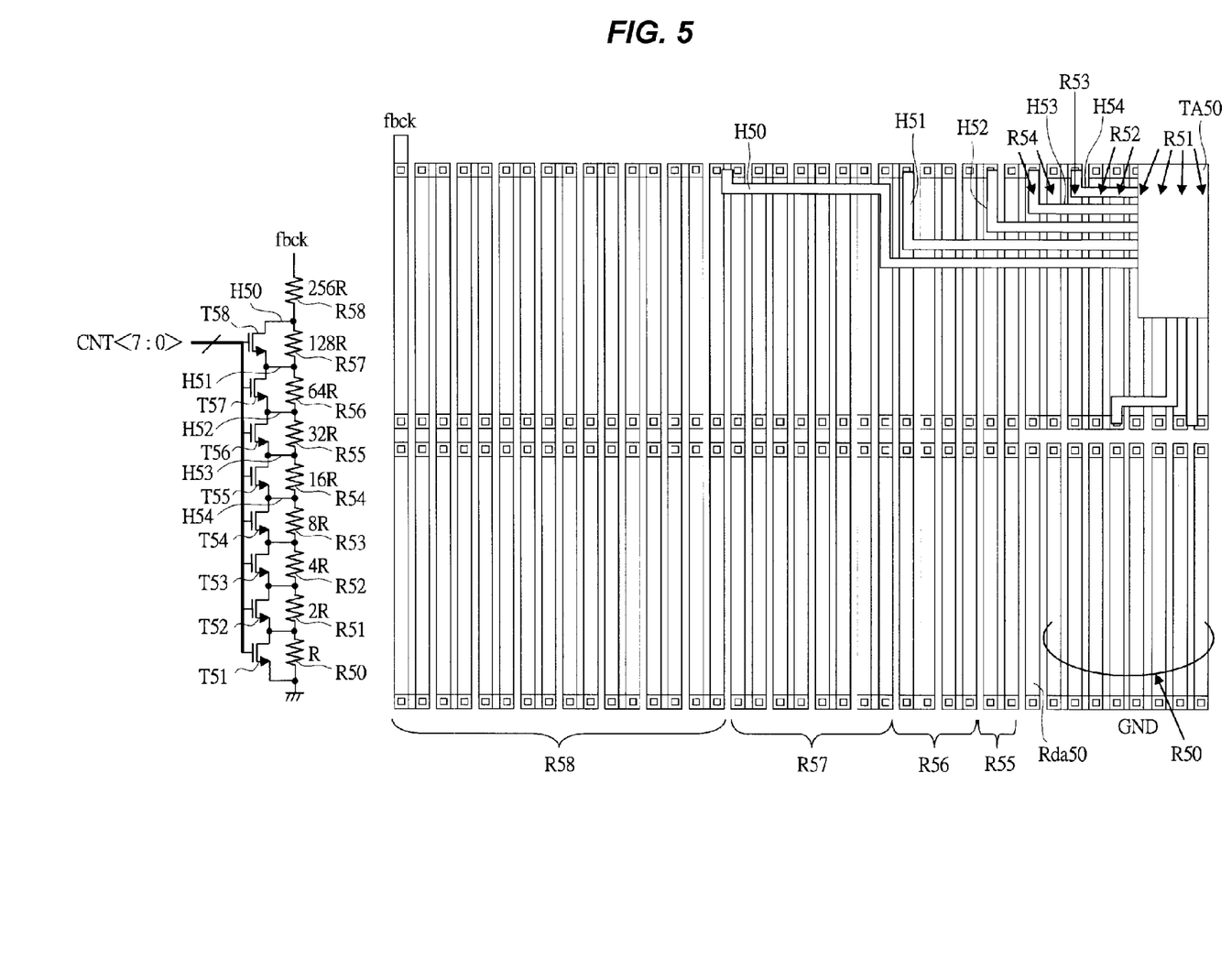
FIG. 5 is an explanatory view showing a layout of resistors in FIG. 3.
Figure 6:
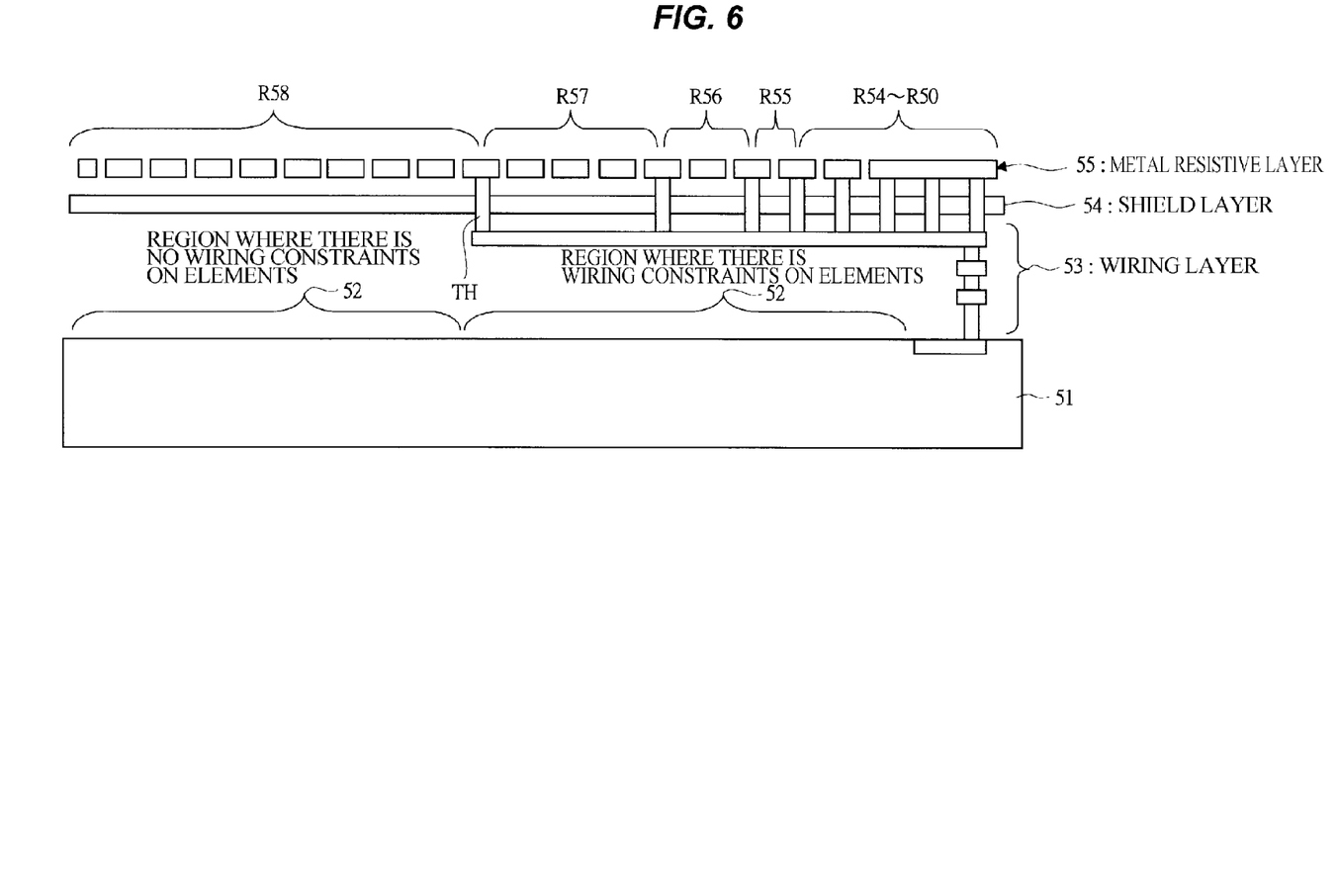
FIG. 6 is an explanatory view schematically showing a cross-sectional structure in FIG. 5.
Figure 7:
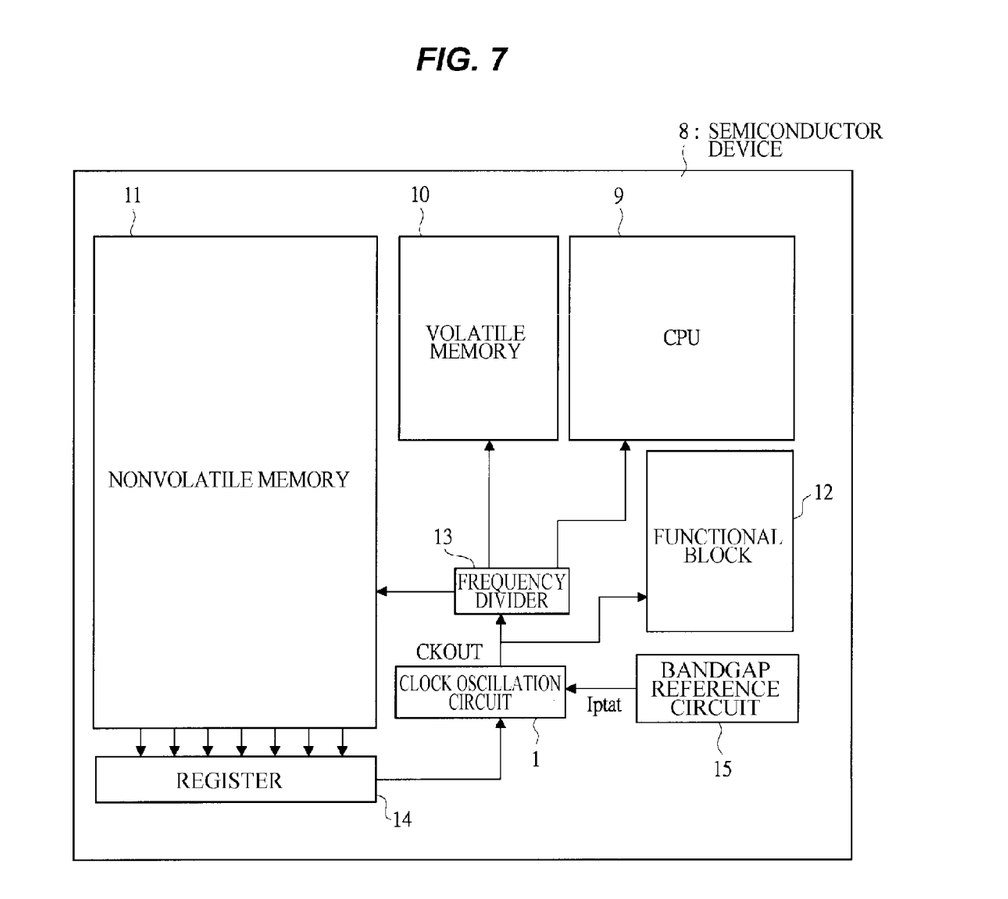
FIG. 7 is a block diagram showing a semiconductor device with the clock oscillation circuit of FIG. 1.
Figure 8:
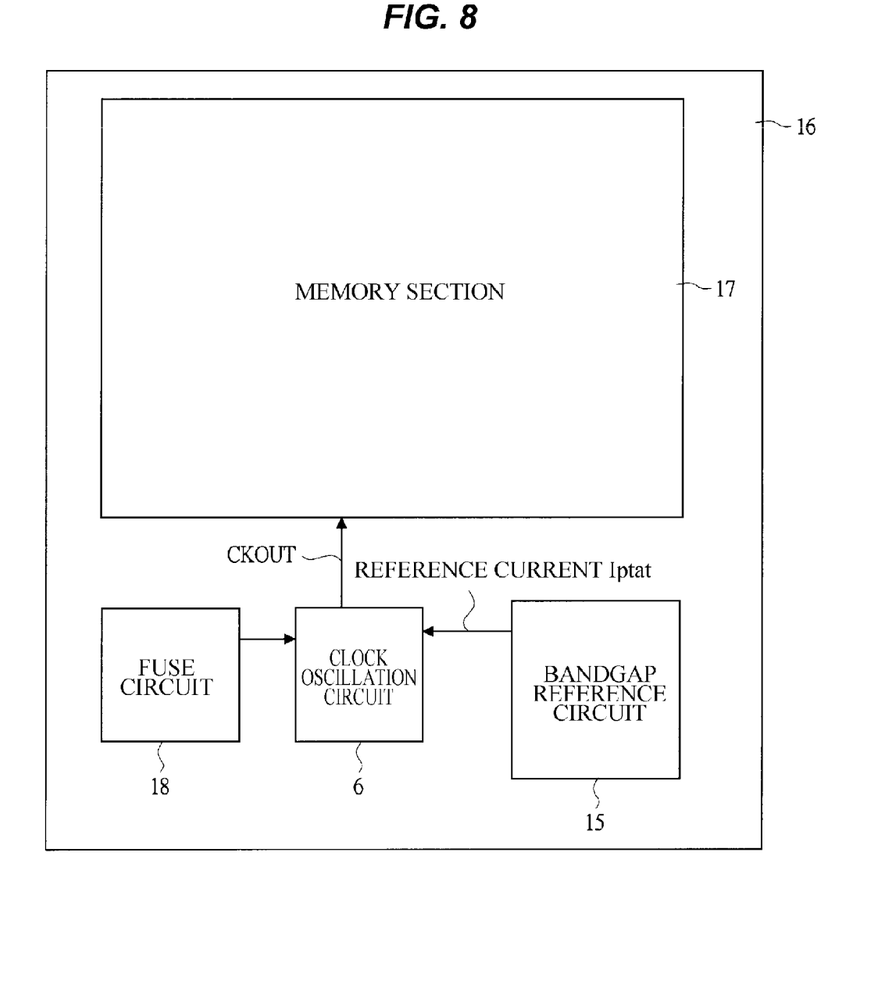
FIG. 8 is a block diagram showing a semiconductor memory with the clock oscillation circuit in FIG. 1.

FIG. 1 is a block diagram showing a configuration of the clock oscillation circuit in accordance with an embodiment of the present invention. FIG. 2 is an explanatory view showing a detailed configuration of the voltage-current conversion circuit in the clock oscillation circuit in FIG. 1. FIG. 3 is an explanatory view showing a configuration of a voltage-current conversion circuit in a clock oscillation circuit which the present inventor studied. FIG. 4 is an explanatory view showing a layout of the resistors in FIG. 2. FIG. 5 is an explanatory view showing a layout of the resistors in FIG. 3. FIG. 6 is an explanatory view schematically showing a cross-sectional structure in FIG. 5. FIG. 7 is a block diagram showing a semiconductor device with the clock oscillation circuit in FIG. 1. FIG. 8 is a block diagram showing a semiconductor memory with the clock oscillation circuit in FIG. 1.

The clock oscillation circuit 1 generates a clock signal and supplies it to the internal module of the semiconductor device. The clock oscillation circuit 1 is a clock generation circuit which includes a reference voltage generation circuit 2, the voltage-current conversion circuit 3, a control circuit 4, a frequency-voltage conversion circuit 5, an integration circuit 6, and a voltage-controlled oscillation circuit (VCO) 7, as shown in FIG. 1, which constitute a feedback loop.

The reference voltage generation circuit 2 includes resistors R1 to R3 and a transistor Q1 which has a bipolar element. The voltage-current conversion circuit 3 includes the operational amplifier AMP1, transistors T1 and T2 which have P channel MOS, and a resistor Rsum.

The frequency-voltage conversion circuit 5 includes switches SW1 to SW3 and an electrostatic capacitive element C1. The integration circuit 6 includes an operational amplifier AMP2 and an electrostatic capacitive element C2.

The reference voltage generation circuit 2 generates the reference voltage VREFI with a temperature characteristic and the reference voltage VREFC with a low power supply dependence and temperature dependence, from a current Iptat with a positive first-order temperature dependence generated by a band gap reference circuit and the like.

The resistor R1 is connected so that the current Iptat generated by the band gap reference circuit and the like is supplied to a first connection part of the resistor R1. The voltage generated at the resistor R1 is the reference voltage VREFI and is output to the voltage-current conversion circuit 3.

The second connection part of the resistor R1 connects to the collector and base of the transistor Q1 and a first connection part of the resistor R3. A first end of the resistor R2 connects to the emitter of the transistor Q1. A reference voltage line VSS is connected to the second connection part of the resistor R2 and the second connection part of the resistor R3. The voltage generated at the resistor R3 is output to the integration circuit 6 as the reference voltage VREFC.

Moreover, the voltage-current conversion circuit 3 generates the current Iref with a low power supply voltage dependence and temperature dependence. The current Iref is generated by applying the reference voltage VREFI to the resistor Rsum with a temperature dependence by a voltage follower circuit having the operational amplifier AMP1. In the reference voltage generation circuit 2, the reference voltage VREFI has a temperature characteristic to cancel the temperature dependence of the resistor Rsum.

The operational amplifier AMP1 is connected so that the reference voltage VREFI is input to its negative (−) input part. The gates of the transistors T1 and T2 connects to the output part of the operational amplifier AMP1

The transistors T1 and T2 are connected so that a power supply voltage VDD is supplied to their sources. The drain of the transistor T1 connects to the positive (+) input part of the operational amplifier AMP1 and a first connection part of the resistor Rsum.

The reference voltage line VSS connects to the second connection part of the resistor Rsum. A current Iconst is output from the second connection part of the transistor T2, and a voltage VNDD is supplied from the drain of the transistor T2 to the switch SW1 of the frequency-voltage conversion circuit 5.

The frequency-voltage conversion circuit 5 generates the voltage VSIG in accordance with on the current Iconst output from the voltage-current conversion circuit 3, the capacitance of the electrostatic capacitive element C1, and a control signal ZCHR generated in the control circuit 4 from clock signal CKOUT output from the voltage controlled-oscillation circuit 7. The control signal ZCHR has the same pulse width as the period of the clock signal CKOUT.

In the frequency-voltage conversion circuit 5, the switch SW1 is connected so that the voltage VNDD is supplied to its first connection part. The second connection part of the switch SW1 connects to a first connection part of the switch SW2, that of the switch SW3, and that of the electrostatic capacitive element C1. Moreover, the reference voltage line VSS connects to the second connection part of the switch SW2 and that of the electrostatic capacitive element C1.

The on/off (conduction/non-conduction) of the switch SW1 is controlled in accordance with the control signal ZCHR output from the control circuit 4, that of the switch SW2 is controlled in accordance with a control signal DISC output from the control circuit 4, and that of the switch SW3 is controlled in accordance with a control signal SAMP also output from the control circuit 4.

The integration circuit 6 includes a parallel switched capacitor integration circuit, for example, and samples the voltage VSIG. The integration circuit 6 generates a control voltage VCNT so that the reference voltage VREFC with a low power supply dependence and temperature dependence equals the voltage VSIG output from the frequency-voltage conversion circuit 5.

The switch SW3 and the operational amplifier AMP2 are connected so that the voltage VSIG output from the second connection part of the switch SW3 is input to the negative (−) input part of the operational amplifier AMP2 and to the first connection part of the electrostatic capacitive element C2.

The operational amplifier AMP2 is connected so that the reference voltage VREFC is input to its positive (+) input part. Its output part connects to the second connection part of the electrostatic capacitive element C2. A voltage is output from the output part to the voltage-controlled oscillation circuit 7 as the control voltage VCNT.

In accordance with the input control voltage VCNT, the voltage-controlled oscillation circuit 7 adjusts the clock signal CKOUT so that this clock signal has a desired frequency, outputting the adjusted signal. Moreover, the voltage-controlled oscillation circuit 7 is connected so that the clock signal CKOUT generated by the voltage-controlled oscillation circuit 7 is input to the control circuit 4, too.

FIG. 2 is an explanatory view showing the configuration of the operational amplifier AMP1, the transistor T1, and the resistor Rsum in the voltage-current conversion circuit 3, in more detail.

The power supply voltage VDD connects to the source of the transistor T1, and the sources of the transistors T2 to T5 connect to the drain of the transistor T1. The output part of a decoder DEC connects to the gates of the transistors T2 to T5.

The decoder DEC decodes control signals CNT6, CNT7, outputs the decoding result to the transistors T2 to T5, and turns on one of these transistors.

Moreover, the resistor Rsum is connected between the drain of the transistor T2 and the reference voltage line VSS. The resistor Rsum includes resistors R4 to R13, which are connected in series from the reference voltage line VSS to the drain of the transistor T2.

The drain of the transistor T3 connects to a connection part between the resistors R13 and R12, that of the transistor T4 connects to a connection part between the resistors R12 and R11, and that of the transistor T5 connects a connection part between the resistors R11 and R10.

The resistor Rsum includes the resistor R5 with twice the resistance (resistance 2R) of the resistor R4 (resistance R); the resistor R6 with twice the resistance (resistance 4R) of the resistor R5 (resistance 2R); the resistor R7 with twice the resistance (resistance 8R) of the resistor R6 (resistance 4R), and the resistor R8 with twice the resistance (resistance 16R) of the resistor R7 (resistance 8R).

The resistor R9 has twice the resistance (resistance 32R) of the resistor R8 (resistance 16R). Moreover, the resistors R11 to R13 are set to twice the resistance (resistance 64R) of the resistor R9 (resistance 32R), and the resistor R10 is set to resistance XR. X is an arbitrary integer and depends on a variable range of the current Iref.

The resistors R4 to R10 connect to transistors T6 to T11 in parallel, respectively. Each of these transistors includes an N channel MOS. The gates of these transistors connect to control signals CNT0 to CNT5, respectively. These transistors perform an on (conduction)/off (non-conductive) operation in accordance with the input control signals CNT0 to CNT5.

The operational amplifier AMP1 has the output part to which the gate of the transistor T1 connects; the negative (−) input part to which the reference voltage VREFI is input; and the positive (+) input part to which a connection part between the drain of the transistor T2 and the resistor R13 connects.

A formula below expresses the combined resistance of the resistor Rsum.

$$Rsum = R \times \begin{pmatrix} X + 128 \times CNT7 + 64 \times CNT6 + \\ 32 \times CNT5 + 16 \times CNT4 + \\ 8 \times CNT3 + 4 \times CNT2 + \\ 2 \times CNT1 + 1 \times CNT0 \end{pmatrix} \quad \text{Formula 2}$$

The above formula shows a relationship between the control signals CNT7 to CNT0 and the combined resistance. For example, to obtain the highest combined resistance, the current needs to pass through all the resistors R4 to R13. Then, the combined resistance is calculated by substituting '1' into CNT7 to CNT0.

When the resistors R4 to R9 are enabled, the control signals CNT0 to CNT5 are output at a low level to control the transistors T6 to T11, respectively.

FIG. 3 is used to describe a configuration of a voltage-current conversion circuit 50 in a clock oscillation circuit which the present inventor studied. Like FIG. 2, FIG. 3 omits the transistors for generating the current Iconst.

Generally, the voltage-current conversion circuit 50 includes a variable ladder resistor section in which resistors and MOS transistors are connected in parallel; and a voltage follower circuit. The variable ladder resistor includes N-channel MOS transistors T51 to T58 and a resistor Rs. The resistor Rs includes resistors R50 to R58. The voltage follower circuit includes an operational amplifier AMP50 and a P-channel MOS transistor T50.

The source of the transistor T50 connects to the power supply voltage VDD and the gate of the transistor connects to the output part of the operational amplifier AMP50. The amplifier is connected so that the reference voltage VREFI is input to its negative (−) input part. Its positive (+) input part connects to the drain of the transistor T50.

Moreover, the resistors R50 to R58 are connected in series between the reference voltage line VSS and a connection part between the drain of the transistor T50 and the positive (+) input terminal of the operational amplifier AMPS50.

The transistors T51 to T58 connects to the resistors R50 to R57 in parallel, respectively. The transistors T51 to T58 are connected so that the control signals CNT0 to CNT5 are input to the gates of the transistors T51 to T59, respectively. The transistors T51 to T58 perform the on (conduction)/off (non-conductive) operation in accordance with the control signals CNT0 to CNT7.

The resistor R51 has twice the resistance (resistance 2R) of the resistor R50 (resistance R), the resistor R52 has twice the resistance (resistance 4R) of the resistor R51 (resistance 2R), the resistor R53 has twice the resistance (resistance 8R) of the resistor R52 (resistance 4R), and the resistor R54 has twice the resistance (resistance 16R) of the resistor R53 (resistance 8R).

The resistor R55 has twice the resistance (resistance 32R) of the resistor R54 (resistance 16R), and the resistor R56 has twice the resistance (resistance 64R) of the resistor R55 (resistance 32R).

Moreover, the resistor R57 has twice the resistance (resistance 128R) of the resistor R56 (resistance 64R). The resistor R58 is set to an arbitrary resistance (resistance XR) so that the current Iref is generated at maximum.

A formula below expresses the combined resistance of the resistor Rs.

$$Rs = R \times \begin{pmatrix} X + 128 \times CNT7 + 64 \times CNT6 + \\ 32 \times CNT5 + 16 \times CNT4 + \\ 8 \times CNT3 + 4 \times CNT2 + \\ 2 \times CNT1 + 1 \times CNT0 \end{pmatrix} \quad \text{Formula 3}$$

Like Formula 2, Formula 3 shows a relationship between the control signals CNT7 to CNT0 and the combined resistance. For example, to obtain the highest combined resistance, the current needs to pass through all the resistors R58 to R50. The combined resistance is calculated by substituting '1' into CNT7 to CNT0.

As shown in Formula 2 and Formula 3, the variable range of the combined resistance of the resistor Rsum (FIG. 2) is the same as that of the resistor Rs (FIG. 3).

The circuit topology in FIG. 3 is an ordinary one, and is quite often used in analog circuits. The on-chip oscillator performs the on/off control of the transistors T51 to T58 connected in parallel to the resistors R50 to R58 by using the control signals CNT0 to CNT7, changes the resistance (resistor Rs), and then switches the oscillation frequencies.

The on-resistance of the transistor T50 should be designed to be lower than the resistor to avoid affecting the frequency accuracy of the on-chip oscillator. The reference of the circuit is the reference voltage line VSS (ground) to remove the power-supply voltage dependence.

It is better to use an N-channel MOS transistor having its substrate connected to the ground power supply. To widen a oscillation frequency range in the on-chip oscillator, the resistance should be designed to be greatly variable.

However, the circuit configuration in FIG. 3 has the following problems.

As previously described, to reduce the influence of the on-resistance of the MOS transistor in the frequency accuracy, the gate width of the transistor or the unit resistance should be increased.

Moreover, if the number of resistors to be coupled in series increases and the variable range widens, no transistors (such as the transistors T58 and T57) connected in parallel in the upper part of the resistor are biased with an enough gate-to-source voltage at low voltage. In addition, the substrate effect, which is caused by the power supplied to the substrate at the ground level, increases the threshold voltage; accordingly the on-resistance of the transistors connected in parallel increases significantly.

This causes the temperature dependence of the generated current and of the oscillation frequency operated and generated by this current. Increasing the gate width of a transistor reduces the influence of the on-resistance of the transistor. A leakage current generated at high temperature causes the temperature dependence of the oscillation frequency.

Because increasing the transistor size directly increases the circuit area, this solution is inappropriate to solve this technical problem. The circuit configuration in FIG. 2 allows the present inventor to solve this problem by allowing a unit resistance to be free from the influence of the on-resistance of the transistor and further by devising a technique for changing the resistances.

Next, the effect of the voltage-current conversion circuit 3 according to the embodiment is described.

The operational amplifier AMP1 in FIG. 2 has the positive (+) input part, to which the circuit node fbck is input; and the negative (−) input part, to which the reference voltage VREFI is input.

The operational amplifier AMP1 is subject to feedback control so that the voltage across the positive (+) input part equals that across the negative (−) input part. Then, the circuit node fbck voltage equals the reference voltage VREFI.

A formula below expresses the current Iref generated by this circuit.

$$Iref = \frac{Vref}{Rsum} \quad \text{Formula 4}$$

The configuration of the transistors T2 to T5 (the transistors corresponding to T57 and T58 in FIG. 3) operated by the control signals CNT7 and CNT6 for the upper bits has changed from the one in which transistors connect to resistors in parallel to the one in which a P-channel MOS selects the current path.

The decoder DEC decodes the input control signals CNT7 and CNT6 and turns on one of the transistors T2 to T5. For example, when these control signals are at a high level, the decoder DEC outputs a signal to turn on the transistor T2. Then, current flows through the resistors R13 to R11.

When the control signal CNT7 is at a high level and the control signal CNT6 is at a low level, the decoder DEC outputs a signal to turn on the transistor T3. Then, current flows through the resistors R12 and R11, not the resistor R13.

When the control signal CNT7 is at a low level and the control signal CNT6 is at a high level, the decoder DEC outputs a signal to turn on the transistor T4. Then, current flows through the resistor R11, not the resistors R12 and R13. When these control signals are at a low level, the decoder DEC outputs a signal to turn on the transistor T5. Then, no current flows through the resistors R13 to R11.

Moreover, the transistors T6 to T11 are turned on/off (conducted/non-conducted) in accordance with the control signals CNT0 to CNT5 to determine whether or not to allow current to flow through the resistors R4 to R9. For example, to cause current to flow through the resistors R9 and R8, the control signals CNT5 and CNT4 are output (at a high level), respectively, to turn on the transistors T11 and T10, respectively.

Moreover, when the control signals CNT5 to CNT0 are at a high level, the transistors T6 to T11 are turned on. Then, no current flows through the resistors R9 to R4.

The circuit configuration in the FIG. 2, in which the transistors T2 to T5 connect to the power supply voltage VDD in parallel, provides the circuit node fbck with feedback control so that the node has the same potential as the reference voltage VREFI. This regulates a variation in the source-drain voltages of the transistors T2 to T5 and significantly reduces the on-resistance.

This can neglect the temperature dependence and the power-supply dependence and prevent the degradation of the frequency accuracy.

Moreover, decreasing the on-resistance of the transistors T2 to T5 eliminates a need to widen the gate of the transistor in FIG. 3. This can reduce the leakage current and regulate the increase in the area.

As a result, the size of the transistors T6 to T11, the operation of which is controlled by the control signals CNT5 to CNT0, can be increased and the unit resistance can be set lower than that in FIG. 3. This can increase the frequency switching resolution and further improve the frequency accuracy.

Moreover, in the circuit configuration in FIG. 3, the on-resistance of the transistor changes significantly during a state transition. An example is as follows: when the transistor T58 is off and the transistors T57 to T51 are on, the transistor T58 is turned on and the transistors T57 to T51 are turned off. In the circuit configuration in FIG. 2, eliminating the influence of the on-resistance of the transistors T2 to T5 prevents the on-resistance from changing significantly and can increase the resolution of the frequency adjustment. The upper bits of the control signal switch the connection of the resistors with high resistances. The lower bits of the control signal switch the connection of the resistors with resistances lower than those of the resistors whose connection is switched by the upper bits of the control signal. So, the frequency accuracy can be improved by decoding the upper bits of the control signal.

In FIG. 2, among the eight bits of the control signals CNT7 to CNT0, the upper two bits of the control signals CNT7 and CNT6 are decoded and the resistors R13 to R11 are switched by the transistors T2 to T5. The number of bits of the control signal to be decoded is not limited to two, and can be changed depending on the number of resistors and that of transistors. As the number of bits of the control signal to be decoded increases, that of decoded control signals increases.

This is because only one of the decoded control signals is selected. The above configuration significantly increases the number of resistors and that of transistors. Therefore, a small number of bits is more preferable. The embodiment employs two bits.

Therefore, all the bits of the control signal are not decoded, but both the upper bit of the control signals to be decoded and the lower bit of the control signals not to be decoded are used. Then, the area can be reduced.

FIG. 4 is an explanatory view showing a layout of the resistors R4 to R13 in FIG. 2.

Because increasing the frequency accuracy is important in the clock oscillation circuit 1, which is an on-chip oscillator, a metal resistive element Rd is used, for example. This is because the second temperature dependence of a metal resistor is small.

The metal resistive element Rd includes a titanium nitride resistor and a tantalum nitride resistor, for example. The metal resistive element Rd has a resistance of 8R, for example. Moreover, the metal resistive element, which is a resistor made from a metal material, is formed on an upper layer of an active device.

The resistor R13 is formed from the upper to lower side on the left of FIG. 4. The resistor R13 includes eight metal resistive elements Rd connected in series via a through-hole TH and a wiring H. In FIG. 4, some of the through-holes TH and the wirings H are represented by symbols. The same symbol indicates the same element. The resistor R12 is formed at the right of the resistor 13. The resistor 11 is formed at the right of the resistor R12. Each of the resistors R11 and R12 also includes eight metal resistive elements Rd connected in series.

The resistor R10 is formed at the right of the resistor R11. The resistor R10 has a resistance value of 256R and includes 32 metal resistive elements Rd connected in series, for example. The resistor R9 is formed at the right of the resistor R10. The resistor R9 includes four metal resistive elements Rd connected in series.

The resistor R8 is formed in the upper right region of the resistor R9. The resistor R7 is formed at the right of the resistor R8. The resistor R6 is formed at the right of the resistor R7. The resistor R5 is formed at the right of the resistor R6. Moreover, the resistor R4 is formed in the lower right region of the resistor R9. A dummy resistor Rda is between the resistor R9 and the resistor R4.

The resistor R8 includes two metal resistive elements Rd connected in series. The resistor R7 includes one metal resistive element Rd. The resistor R6 includes two metal resistive elements Rd connected in parallel. The resistor R5 includes four metal resistive elements Rd connected in parallel. The resistor R4 includes eight metal resistive elements Rd connected in parallel.

A transistor area TA1, in which the transistors T2 to T5 are formed, is above the resistor R13 in FIG. 4. A transistor area TA2, in which the transistors T6 to T11 are formed, is above the resistor R5.

The drain of the transistor T4 in the transistor area TA1 (see the circuit diagram on the left side of FIG. 4) connects to the connection part between the resistor R12 and the resistor R11 via a wiring H1 formed in a wiring layer (see the circuit diagram on the left side of FIG. 4).

The drain of the transistor T5 (see the circuit diagram on the left side of FIG. 4) connects to the connection part between the resistor R11 and the resistor R10 via a wiring H2 formed in the wiring layer (see the circuit diagram on the left side of FIG. 4).

Moreover, the connection part between the transistor T6 and the transistor T7 in the transistor area TA2 connects to the connection part between the resistor R4 and the resistor R5 via a wiring H3 (see the circuit diagram on the left side of FIG. 4) formed in the wiring layer.

The connection part between the transistor T8 and the transistor T9 in the transistor area TA2 connects to the connection part between the resistor R6 and the resistor R7 via a wiring H4 (see the circuit diagram on the left side of FIG. 4) formed in the wiring layer. The connection part between the transistor T9 and the transistor T10 in the transistor area TA2 connects to the connection part between the resistor R8 and the resistor R7 via a wiring H5 (see the circuit diagram on the left side of FIG. 4) formed in the wiring layer.

Furthermore, the connection part between the transistor T10 and the transistor T11 in the transistor area TA2 connects to the connection part between the resistor R9 and the resistor R8 via a wiring H6 (see the circuit diagram on the left side of FIG. 4) formed in the wiring layer.

The drain of the transistor T11 in the transistor area TA2 connects to the connection part between the resistor R9 and the resistor R10 via a wiring H7 (see the circuit diagram on the left side of FIG. 4) formed in the wiring layer.

This case eliminates a need to connect the transistors T2 to T5 and the transistors T6 to T11. The transistor area TA1, in which the transistors T2 to T5 are formed, can be separated from the transistor area TA2, in which the transistors T6-T11 are formed.

Thus, each of the transistor areas TA1 and TA2 can be arranged near the terminals of the resistors to be connected. Even increasing the number of the metal resistive elements Rd can reduce the wiring length and then the wiring resistance.

FIG. 4 has described the case where the resistors R4 to R13 include the metal resistive element Rd. These resistors may be formed by a polysilicon resistor or the like.

This case, too, allows the transistor area TA1, in which the transistors T2 to T5 are formed, to separate from the transistor area TA2, in which the transistors T6 to T11 are formed, and allows the wirings H1 to H7 to be shortened.

In FIG. 4, the transistor area TA1 is at the upper left and the transistor area TA2 is at the upper right. These transistor areas may be arranged to shorten the wiring. Their arrangement is not limited to that in FIG. 4.

FIG. 5 is an explanatory view showing a layout of the resistors R50 to R58 in FIG. 3.

Like in FIG. 4, the resistors R50 to R58 are formed from a metal resistive element Rd50. The resistor R58 is formed from the upper left to the lower left in FIG. 4. The resistor R58 includes 32 metal resistive elements Rd50 connected in series.

The metal resistive element Rd50 includes a titanium nitride resistor and a tantalum nitride resistor. The metal resistive element Rd50 is a resistance of 8R. The metal resistive element, which is a resistor made from a metal material, is formed in an upper layer of the active device.

The resistor R57 is formed at the left of the resistor R58. The resistor R56 is formed at the right of the resistor 57. The resistor R57 includes 16 metal resistive elements Rd50 connected in series. The resistor R56 includes eight metal resistive elements Rd50 connected in series.

The resistor R55 is formed at the right of the resistor R56. The resistor R55 includes four metal resistive elements Rd50 connected in series. The resistor R54 is formed in the upper right region of the resistor 55. The resistor R53 is formed at the right of the resistor R54.

The resistor R52 is formed at the right of the resistor 53. The resistor R51 is formed at the right of the resistor R52. The resistor R50 is formed in the lower right region of the resistor R55. A dummy resistor Rda50 is between the resistors R55 and R50.

The resistor R54 includes two metal resistive elements Rd50 connected in parallel. The resistor R53 includes one metal resistive element Rd50. The resistor R52 includes two metal resistive elements Rd50 connected in parallel. The resistor R51 includes four metal resistive elements Rd50 connected in parallel. Moreover, the resistor R50 includes eight metal resistive elements Rd50 connected in parallel.

A transistor area TA50, which has the transistors T51 to T58, is at the upper side of the resistor R51 in FIG. 5. Moreover, the connection part between the resistors R58 and R57 connects to the transistor T58 formed in the transistor area TA50 via a wiring H50 (see the circuit diagram on the left in FIG. 5) formed in the wiring layer.

The connection part between the resistors R57 and R56 connects to the connection part between the transistors T58 and T57 which is formed in the transistor area TA50 via a wiring H51 (see the circuit diagram on the left in FIG. 5) formed in the wiring layer.

The connection part between the resistors R56 and R55 connects to the connection part between the transistors T57 and T56 which is formed in the transistor area TA50 via a wiring H52 (see the circuit diagram on the left in FIG. 5) formed in the wiring layer.

The connection part between the resistors R55 and R54 connects to the connection part between the transistors T56 and T55 which is formed in the transistor area TA50 via a wiring H53 (see the circuit diagram on the left in FIG. 5) formed in the wiring layer. The connection part between the resistors R54 and R53 connects to the connection part between the transistors T55 and T54 which is formed in the transistor area TA50 via a wiring H54 (see the circuit diagram on the left in FIG. 5) formed in the wiring layer.

In this case, the source or drain of one transistor is in common with that of other transistor. For example, the drain of the transistor T51 is in common with and the source of the transistor T52. The drain of the transistor T52 is in common with the source of the transistor T53. The wiring will lengthen if the transistors are separated. It is preferable to arrange the transistors near to each other, in accordance with in the transistor area TA50 in FIG. 5.

Arranging the transistors near to each other increases the number of resistive elements to be connected in series. The distance from the resistor with a high resistance to a transistor to be connected will increase and the wiring will lengthen, as in the wirings H50 and H51.

FIG. 6 is an explanatory view schematically showing a cross-sectional structure in FIG. 5.

A semiconductor device region 52, which has semiconductor devices such as a transistor, is formed at the upper part of the semiconductor substrate 51. A wiring layer 53, which has the wiring H for interconnection, is formed above the semiconductor device region 52.

A shield layer 54 for eliminating the influence from the under layer is formed above the wiring layer 53. A metal resistive layer 55, which has a plurality of metal resistive element Rd50, is formed above the shield layer 54.

A resistive element formed in the metal wiring layer 55 connects to a transistor formed in the semiconductor device region 52 via the wiring H formed in the wiring layer 53 and the through-hole TH.

The wiring H formed in the wiring layer 53 will be used as the wiring for connecting semiconductor devices formed in the semiconductor device region 52. When the resistors R50 to R58 and the wirings for connecting the transistors T51 to T58 are formed in the wiring layer 53, the constraints on wiring increase.

When a semiconductor device other than the transistors T51 to T58 is formed in the semiconductor device region 52 at the right in FIG. 6, a wiring connection to this semiconductor device may be impossible.

As described above, the layout in FIG. 4 allows to shorten the wiring required to connect the transistor areas TA1 and TA2 to the resistors and to minimize the constraints on wiring. Decreasing the constraints on wiring leads to easy layout of other semiconductor devices.

FIG. 7 is a block diagram showing a semiconductor device 8 having the clock oscillation circuit 1 in FIG. 1.

As shown in the view, the semiconductor device 8 includes the clock oscillation circuit 1; internal circuits, such as the CPU (Central Processing Unit) 9, the volatile memory 10, a nonvolatile memory 11, a functional block 12, and a frequency divider 13; a register 14; and a band gap reference circuit 15.

The CPU9 is a central processing unit of the semiconductor device 8. The volatile memory 10 includes a semiconductor memory, such as an SRAM (Static Random Access Memory).

The nonvolatile memory 11 is a semiconductor memory exemplified by a flash memory. The functional block 12 includes circuit blocks for an arbitrary function, such as an A/D (Analog/Digital) converter.

The frequency divider 13 divides the frequency of the clock signal CKOUT which the clock oscillation circuit 1 has generated, and then supplies the signal to the CPU9, the volatile memory 10, and the nonvolatile memory 11. Moreover, the clock signal CKOUT which the clock oscillation circuit 1 has generated is supplied to the functional block 12.

The register 14 temporarily stores the data read from the nonvolatile memory 11, and outputs the data to the clock oscillation circuit 1 as the control signals CNT0 to CNT7 (FIG. 2).

The band gap reference circuit 15 is a circuit which, as a reference voltage source, generates a voltage having a small variation relative to a temperature variation. The band gap reference circuit 15 generates the current Iptat with a positive first temperature dependence and supplies this current to the clock oscillation circuit 1.

The control signals CNT0 to CNT7 are written to the nonvolatile memory 11 in advance. When the semiconductor device 8 activates, these control signals read from the nonvolatile memory 11 are written to the register 14.

In writing the control signals CNT0 to CNT7 to the register 14, a fuse or the like other than the nonvolatile memory 11 may be used. The variable oscillation frequency range in the clock oscillation circuit 1 is, for example, about 32 to 50 MHz. The oscillation frequency is assumed to be adjusted at approximately ±1%. The accuracy of the control signal required for this adjustment is approximately 8 bits.

Moreover, the clock oscillation circuit 1 can arbitrarily set the temperature characteristic of the frequency to be positive (frequency heightens as temperature becomes high) or negative (frequency heightens as temperature becomes low) by adjusting the ratio of the reference voltage VREFI to reference voltage VREFC. The temperature is trimmed by measuring the oscillation frequency of the clock oscillation circuit 1 at a plurality of temperatures and calculating the temperature dependence coefficient of the oscillation frequency.

Alternatively, the clock oscillation circuit 1 with much freedom of the temperature dependence of the frequency can be used as a reference clock generation circuit which performs self-refresh required to retaining the data of a semiconductor memory, such as a DRAM (Dynamic Random Access Memory).

FIG. 8 is a block diagram showing a semiconductor memory 16 having the clock oscillation circuit 1 in FIG. 1.

As shown in the view, the semiconductor memory 16 includes the clock oscillation circuit 1, the band gap reference circuit 15, a memory section 17, and a fuse circuit 18. The memory section 17 is a volatile memory such as a DRAM, for example.

The fuse circuit 18 generates a predetermined signal and outputs the signal to the clock oscillation circuit 1 as the control signals CNT0 to CNT7 (FIG. 2). The other configuration is the same as that of FIG. 7. Its description is omitted.

The data retention capability of the DRAM degrades at high temperatures. At high temperature's, the refresh preferably should be performed at a high frequency relative to the frequency at room temperature. If the frequency of the refresh is set high for the refresh at a high temperature, more refreshes than necessary are performed at room temperature or at low temperatures. This increases the consumption current.

Figure 9:
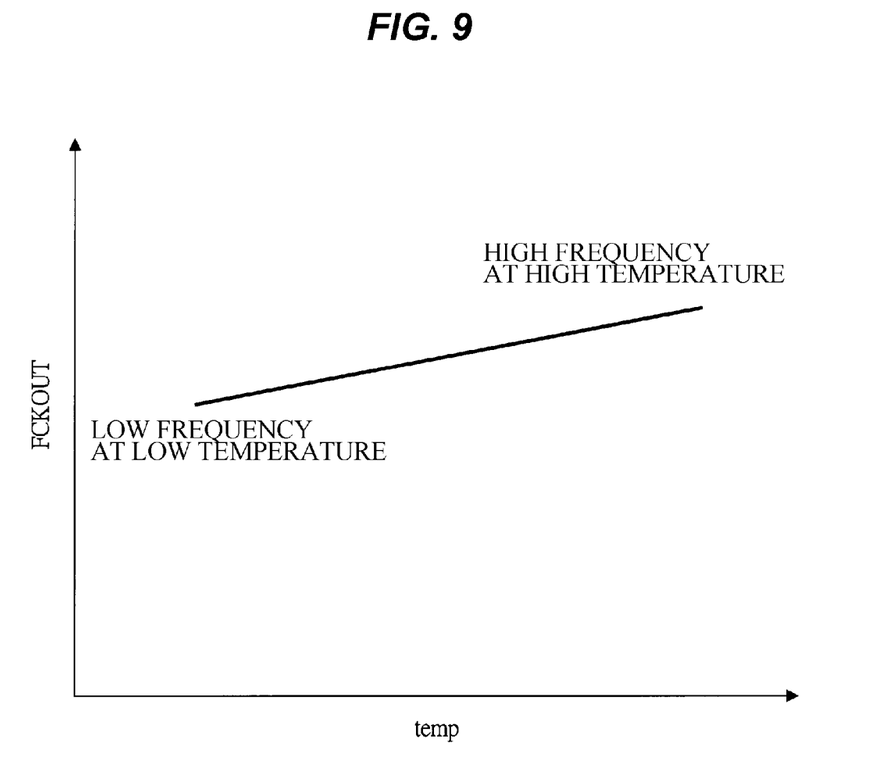
FIG. 9 is an explanatory view showing a frequency characteristic of a clock signal from at high temperature to at low temperature in the clock oscillation circuit in FIG. 1.

As shown in FIG. 9, the clock oscillation circuit 1 can increase the frequency only at high temperatures by giving a first positive temperature coefficient characteristic to the clock oscillation circuit 1 by temperature trimming. This can improve the data retention capability at high temperatures and can regulate the consumption current at room temperature and at low temperatures.

According to the embodiment, the on-resistances of the transistors T2-T5 in the voltage-current conversion circuit 3 are reduced significantly, and the temperature dependence and power-supply dependence of the transistors T2 to T5 can be neglected. Then, the frequency accuracy of the clock signal CKOUT can be improved.

Each of the transistors T2 to T5 and the transistors T6 to T11 can be arranged near the resistors to be connected. The wiring resistance can be reduced.

The following method has been described: A method for adjusting frequency in a wide range by changing the resistance, by and increasing the resolution of the clock oscillation frequency adjustment, and without changing the oscillation frequency accuracy. Depending on the specification of the oscillation frequency required, the method may be used in combination with a method for changing a capacitance.

The voltage-current conversion circuit used in the clock oscillation circuit according to the present invention can be used not only in the clock oscillation frequency but also in a reference voltage generation circuit and the like which require highly accurate adjustment.

The present invention is suitable for the techniques of generating a highly accurate clock signal in semiconductor devices with a clock oscillation circuit internally generating an operation clock.

What is claimed is:

1. A semiconductor device comprising:
   a clock oscillation circuit which comprises a voltage current conversion circuit, a frequency-voltage conversion circuit, and an oscillation circuit outputting a clock signal,
   wherein the voltage-current conversion circuit includes
      a transistor supplying a reference current;
      an operational amplifier having a positive input part, a negative input part, and an output part;
      a first resistor-switching section connected between a drain of the transistor and a first node;
      a second resistor-switching section connected between the first node; and
      a ground voltage line to which a ground voltage is supplied,
   wherein the first resistor-switching section has a first resistor section of which a first end is connected to the first node and a first path-switching section including a first and a second switch connected to the drain of the transistor,
   wherein the first resistor section includes a first resistor and a first plurality of additional resistors connected in series,
   wherein the first path-switching section determines whether to supply the reference current to the first resistor and the second resistor-switching section via the first switch or to supply the reference current to the second resistor-switching section via the second switch without feeding the reference current to the first resistor, using a control signal,
   wherein the negative input part of the operational amplifier is supplied a reference voltage, the positive input part of the operational amplifier is connected to the second end of the first resistor section, and the output part of the operational amplifier is connected to a gate of the transistor, and wherein the frequency-voltage conversion circuit outputs an output voltage to the oscillation circuit according to an output current outputted from the voltage-current conversion circuit and a frequency of the clock signal.

2. The semiconductor device according to claim 1, wherein each of the first resistor section and the second resistor section includes a metal wiring resistor.

3. The semiconductor device according to claim 2, wherein the first resistor section is in an upper layer of the first path-switching section and the second resistor section is in an upper layer of the second path-switching section.

4. The semiconductor device according to claim 1, wherein each of the first resistor section and the second resistor section includes a polysilicon resistor.

5. The semiconductor device according to claim 1,
wherein the second resistor-switching section has a second resistor section which includes a second resistor and in which a second plurality of additional resistors is connected in series, and a second path-switching section which includes a third switch controlled by the control signal, and
wherein the third switch is connected in parallel to the second resistor.

6. The semiconductor device according to claim 5, wherein the first switch and the second switch are P-channel MOS transistors and the third switch is an N-channel MOS transistor.

7. The semiconductor device according to claim 5, wherein the first switch and the second switch are nearer to the first resistor section than to the second resistor section, the third switch is nearer to the second resistor section than to the first resistor section, and the first switch, the second switch, and the third switch are separated from each other.

8. The semiconductor device according to claim 5, wherein a resistance of the first resistor is larger than that of the resistors constituting the second resistor section.

9. The semiconductor device according to claim 8,
wherein the second plurality of additional resistors connected in series constituting the second resistor section has a resistance of twice sequentially from the resistor connected to the reference voltage line, respectively, and
wherein at least one of the resistors constituting the first resistor section has twice a resistance of a largest resistor among the resistors constituting the second resistor section.

10. The semiconductor device of claim 1, wherein the oscillation circuit includes an integration circuit and a voltage-controlled oscillation circuit.

* * * * *